(12) United States Patent
Beier et al.

(10) Patent No.: US 7,806,719 B2
(45) Date of Patent: Oct. 5, 2010

(54) MODULE HAVING TERMINALS FOR ACTUATORS AND/OR SENSORS

(75) Inventors: Thomas Beier, Schloss Holte-Stukenbrock (DE); Bernd Behling, Steinheim (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 36 days.

(21) Appl. No.: 12/301,005

(22) PCT Filed: May 2, 2007

(86) PCT No.: PCT/EP2007/003851

§ 371 (c)(1),
(2), (4) Date: Nov. 14, 2008

(87) PCT Pub. No.: WO2007/131631

PCT Pub. Date: Nov. 22, 2007

(65) Prior Publication Data

US 2009/0258532 A1 Oct. 15, 2009

(30) Foreign Application Priority Data

May 17, 2006 (DE) ........................ 10 2006 023 351

(51) Int. Cl.
*H01R 4/24* (2006.01)
(52) U.S. Cl. ...................... 439/410; 439/716
(58) Field of Classification Search .................. 439/410, 439/716, 409
See application file for complete search history.

(56) References Cited

U.S. PATENT DOCUMENTS 5,321,592 A 6/1994 Marinacci et al.
6,471,552 B2 * 10/2002 Bechaz et al. ............... 439/716
6,916,214 B2 * 7/2005 Conrad ....................... 439/716
7,462,060 B2 * 12/2008 Hamoignon ................ 439/409
2004/0235335 A1 * 11/2004 Schoeffel et al. ............ 439/410

FOREIGN PATENT DOCUMENTS

DE 19630352 1/1998

(Continued)

OTHER PUBLICATIONS

International Search Report for International No. PCT/EP2007/003851 mailed on Aug. 8, 2007.

*Primary Examiner*—Gary F. Paumen
(74) *Attorney, Agent, or Firm*—Leydig, Voit & Mayer, Ltd.

(57) ABSTRACT

A module having terminals for actuators and sensors includes a lower portion having at least one recess configured to receive a shape-coded ribbon cable, and an upper housing portion configured to receive a circuit board and to be disposed on the lower portion via a fastening device. The module further including a guidance device configured to cooperate with the first and second longitudinal sides of the upper housing portion so that the upper housing portion is guidable into an initial fastening position. Further, at least one of the upper housing portion and the lower portion include a contact device having at least one contact pin configured to at least partially penetrate the shape-coded ribbon cable when the shape-coded ribbon cable is received in the at least one recess so as to contact with the plurality of conductors when the upper housing portion is fastened to the lower portion.

24 Claims, 8 Drawing Sheets

FOREIGN PATENT DOCUMENTS

| | | |
|---|---|---|
| DE | 29919900 | 3/2001 |
| DE | 29919901 | 4/2001 |
| DE | 19947834 | 5/2001 |
| DE | 10025296 | 12/2001 |
| FR | 2331167 | 6/1977 |
| WO | WO-0122534 | 3/2001 |

* cited by examiner

MODULE HAVING TERMINALS FOR ACTUATORS AND/OR SENSORS

CROSS REFERENCE TO RELATED APPLICATIONS

This application is a U.S. National Phase application under 35 U.S.C. §371 of International Application No. PCT/EP2007/003851, filed May 2, 2007, and claims benefit to German Patent Application No. DE 10 2006 023 351.4, filed May 17, 2006. The International Application was published in German on Nov. 22, 2007 as WO/2007/131631 under PCT Article 21(2).

FIELD

The present invention relates to a module having terminals for actuators and/or sensors, and having a recess for a shape-coded ribbon cable and a fastening device for a circuit board.

BACKGROUND

DE 196 30 352 C2 describes a module made up of a lower part and an upper housing part having a circuit board arranged in the interior. The upper housing part is embodied in substantially cuboidal fashion and includes an upper side, lower side, and peripherally two longitudinal sides as well as two end faces. Terminals for actuators and/or sensors are arranged on the upper side. They are embodied as plug terminals and/or screw terminals, and are connected to the circuit board located in the upper housing part. Contacting pins of a contacting device are soldered onto the circuit board. They project with their tips out of the lower side.

The lower part includes an upper side, adapted in its dimensions to the lower side, having recesses for the reception of two shape-coded ribbon cables that can be embodied, for example, as bus conductors or control conductors.

For accurate guidance of the upper housing part into an initial fastening position in which the contact pins face exactly, with their tips, toward the conductor strands of ribbon cables placed into the lower part, on the one hand pivoting means, as well as positioning lugs having corresponding receptacles in the region of the receptacles for the ribbon cables, are provided on the end face of the upper housing part and of the lower part. From the initial fastening position, the upper housing part can be connected centrally in the contact region to the lower part, and through-contacting of shape-coded ribbon cables placed into the lower part with the contact pins can be ensured.

SUMMARY

It is an aspect of the present invention to provide a module, having terminals for actuators and/or sensors, with an alternative and simple capability for guiding the upper housing part into its initial fastening position.

An embodiment of the present invention provides a module having terminals for actuators and sensors. The module includes a lower portion having at least one recess configured to receive a shape-coded ribbon cable having a plurality of conductors, and an upper housing portion configured to receive a circuit board and to be disposed on the lower portion via a fastening device. The upper housing portion includes a first longitudinal side, a second longitudinal side, a first end face, and a second end face. The module further includes a guidance device disposed on at least one of the upper housing portion and the lower portion and configured to cooperate with the first and second longitudinal sides of the upper housing portion so that the upper housing portion is guidable into an initial fastening position for fastening the upper housing portion to the lower portion. Further, at least one of the upper housing portion and the lower portion include a contact device having at least one contact pin configured to at least partially penetrate the shape-coded ribbon cable when the shape-coded ribbon cable is received in the at least one recess so as to contact with the plurality of conductors when the upper housing portion is fastened to the lower portion.

BRIEF DESCRIPTION OF THE DRAWINGS

The module according to the present invention is described below in an exemplifying embodiment and depicted graphically. In the drawings.

DETAILED DESCRIPTION

Figure 1:
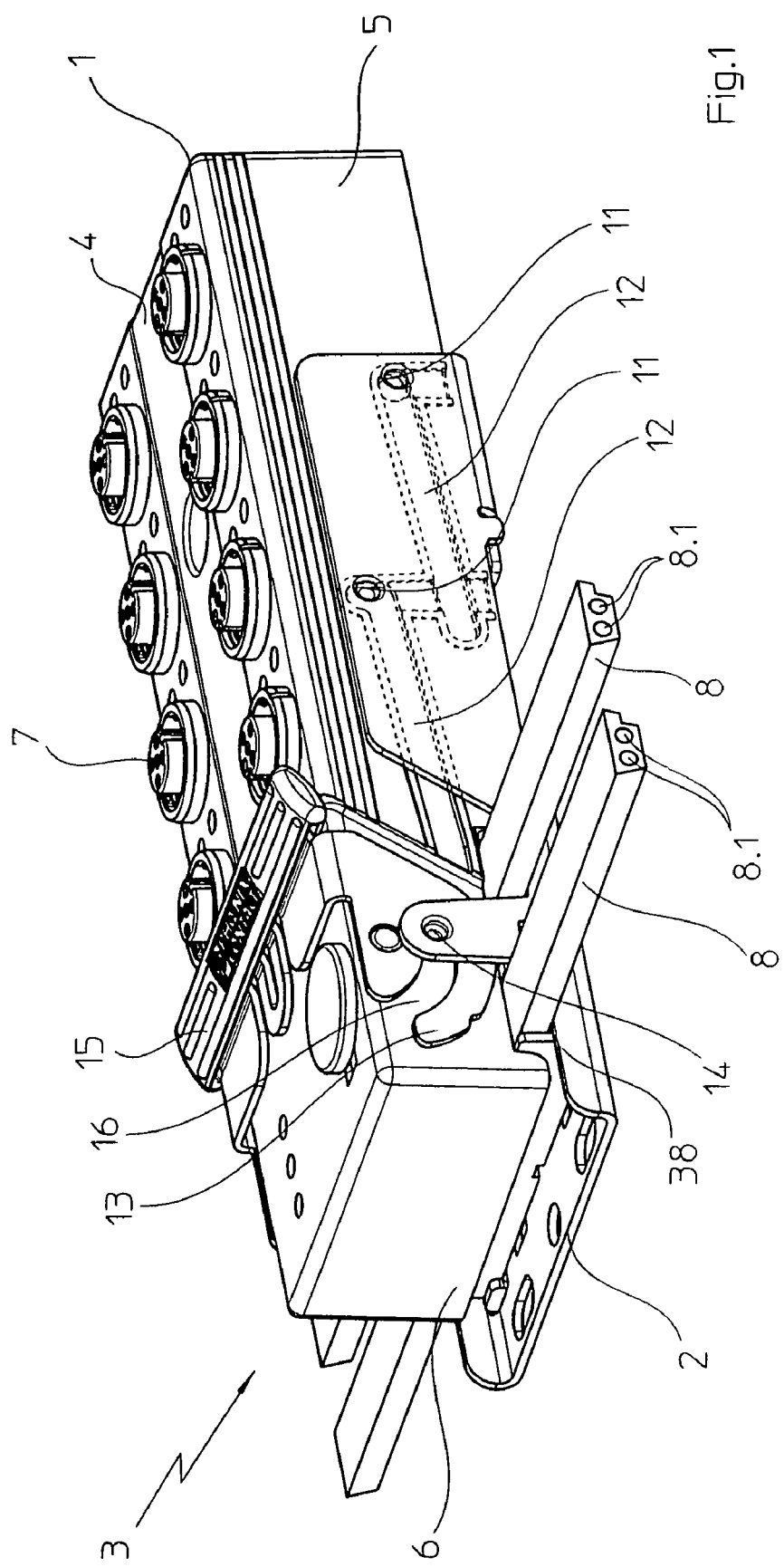
FIG. 1 shows, in perspective, a module according to the present invention having an upper housing part and a lower part, in the closed state.

A module according to an embodiment of the present invention includes a guidance device coacting with the longitudinal sides of the upper housing part. The advantage achieved thereby is that the upper housing part can be guided particularly easily onto the lower part and into the initial fastening position for fastening of the two module parts. In addition, the advantage is achieved that with this type of guidance, the upper housing part is aligned onto the lower part in the transverse direction of the module.

In order to minimize tolerances of the upper housing part with respect to the lower part in the transverse direction in the initial fastening position, an advantageous refinement of the present invention provides that the guidance device is configured in such a way that they are suitable for peripheral clamping of the upper housing part. This is very easy if the side walls of the lower part function as a guidance device for the upper housing part. Alignment of the upper housing part in the longitudinal direction can be achieved by way of grooves and/or stop elements mounted on the longitudinal sides or side walls.

The upper housing part includes, in addition to its longitudinal sides and end faces, an upper side, adjacent thereto, having the terminals for the actuators and/or sensors, and a lower side. In the case of actuators and/or sensor already connected to the terminals, additionally changing of the ribbon cables is often necessary. Provision is therefore made that the upper housing part can be moved into an installation position in which access is provided to inserted ribbon cables. Typically, the module can be guided into the installation position by pivoting up the upper housing part. Pivoting up the lower part is, however, often unfavorable for space reasons. If the module is installed on a wall, for example, the pivoting-up angle is limited by the actuators and/or sensors, with their cables, connected on the upper side. When swung up, they strike against the wall and in that context may be damaged.

An advantageous refinement therefore provides that the guidance device is embodied, on the upper housing part and/or the lower part, in such a way that the upper housing part is guidable out of the initial fastening position into the installation position, and guidable back, by way of a transversal motion. When, according to this embodiment, the upper housing part is guided from the initial fastening position via a transversal motion into the installation position, the connected sensors do not impede this operation. In the simplest case, the transversal motion can be implemented by displacing the upper housing part with respect to the lower part.

For controlled guidance of the upper housing part into the initial fastening position from which the upper housing part can be fastened onto the lower part, provision is made in a refinement according to the present invention that at least one guidance groove is provided on each of the two longitudinal sides of the upper housing part, and at least one guidance peg facing toward to the opposite side wall is provided on each of the two side walls of the lower part, as a guidance device. With this refinement, the upper housing part coacts with the lower part in such a way that the guidance pegs engage into the guidance grooves. The upper housing part is thereby secured transversely to the course of the guidance grooves. This advantage also exists when the upper housing part is guided from the initial fastening position into the installation position, in which shape-coded ribbon cables can be placed into the recesses provided in the base of the lower part, or those already in place can be replaced with others.

In order also to secure the upper housing part against any displacement in the direction in which the groove extends, a refining configuration of the present invention provides that the guidance grooves each include at least one detent position for detent engagement of the guidance pegs guided therein. The detent position can be embodied, for example, by way of a depression, positively fitting with respect to the guidance pegs, within the guidance grooves. The detent engagement allows the upper housing part to be held in the installation position independently of the spatial alignment of the module, so that an installer can, with both hands, replace shape-coded ribbon cables already placed into the lower part.

A further refinement according to the present invention provides that the guidance groove has two detent positions. The result of this is that the upper housing part and the lower part are joined in lossproof fashion to one another as soon as the guidance pegs engage into the guidance grooves. It is advantageous in this context to arrange the detent positions in such a way that they immobilize the upper housing part with respect to the lower part in the initial fastening position and in the installation position.

Usefully, a respective insertion groove leading to the guidance groove and proceeding from the edge of the respective side wall is provided on the two side walls of the upper housing part.

To ensure that stable and tiltproof guidance of the upper housing part is achieved, at least two guidance grooves, arranged parallel to one another, are provided on each of the two longitudinal sides of the upper housing part, two guidance pegs associated with the guidance grooves being embodied on each of the two side walls of the lower part. As an alternative thereto, however, it is also conceivable to provide a single guidance groove as a guidance device, and instead of a guidance peg of round configuration to provide a guidance element that is elongated in cross section.

An advantageous refinement provides that the two guidance grooves arranged parallel to one another are connected to one another by a connecting groove. Guidance pegs can be guided from one guidance groove into the other by way of the connecting groove, so that the location of the upper housing part with respect to the lower part can be modified.

In order to enable rapid fastening of the module to a support rail arranged, for example, in an electrical cabinet, a particular embodiment of the present invention provides that a cutout area is provided in the base of the lower part, a support rail being receivable, with its retaining segments, via a segment of the edge region adjacent to said area.

FIG. 1 shows a module 3, assembled from an upper housing part 1 and a lower part 2, in the installed and closed state. Upper housing part 1 is preferably embodied cuboidally, and includes an upper side 4, a lower side arranged parallel thereto and not depicted, and peripherally two longitudinal sides 5 and two end faces 6. Terminals 7 for plug connectors of actuators and/or sensors are arranged on upper side 4. These terminals 7 are connected, via a circuit board (not depicted) received in upper housing part 1, to contact pins of a contact device that project out of the lower side. When module 3 is in the closed state as shown in FIG. 1, the contact tips penetrate through at least partially into shape-coded ribbon cables 8 placed into lower part 2, and thereby ensure an electrical contact between terminals 7 and conductors 8.1 of shape-coded ribbon cables 8.

Figure 2:
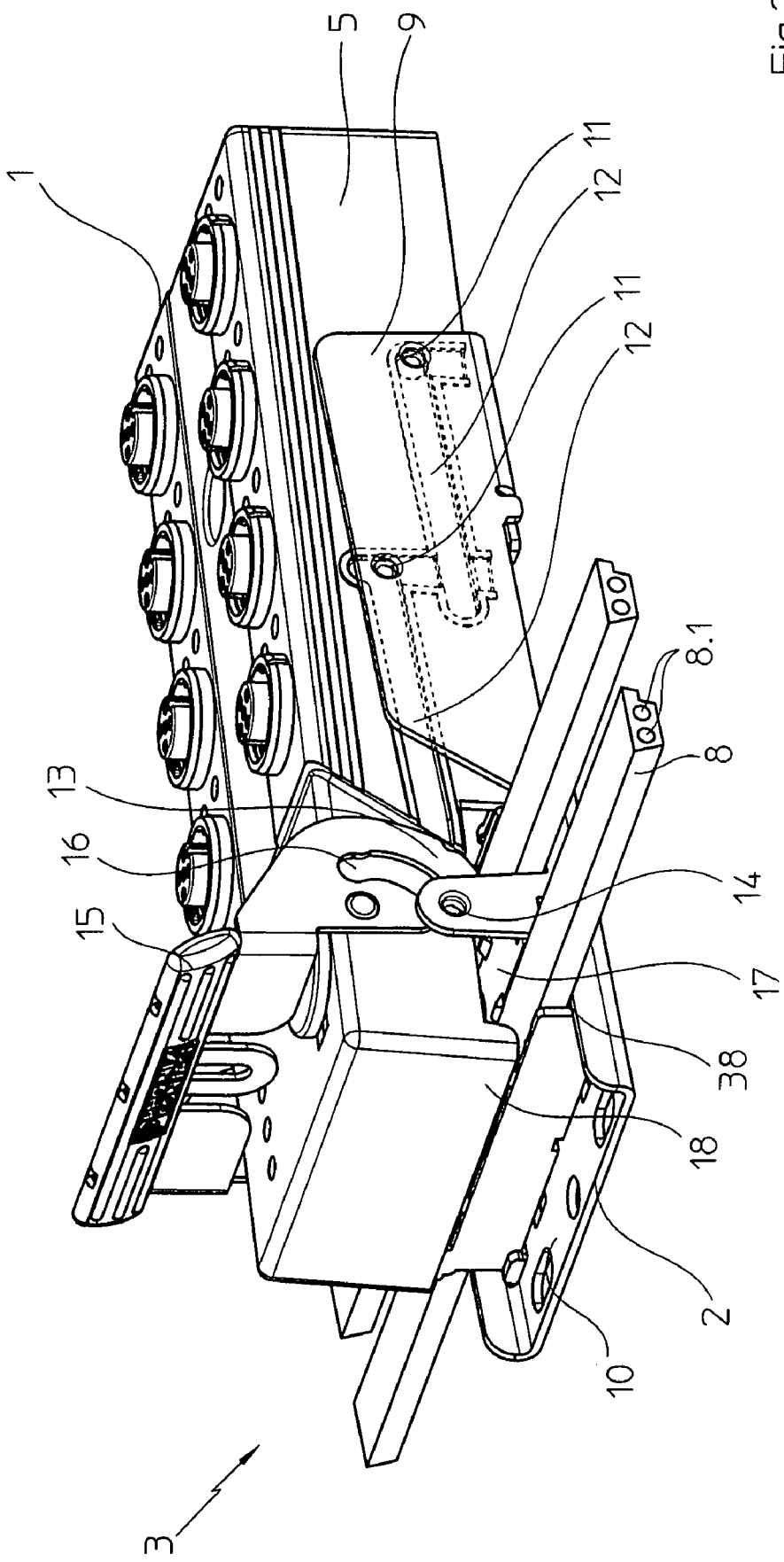
FIG. 2 shows the module of FIG. 1 in the initial fastening position.
Figure 3:
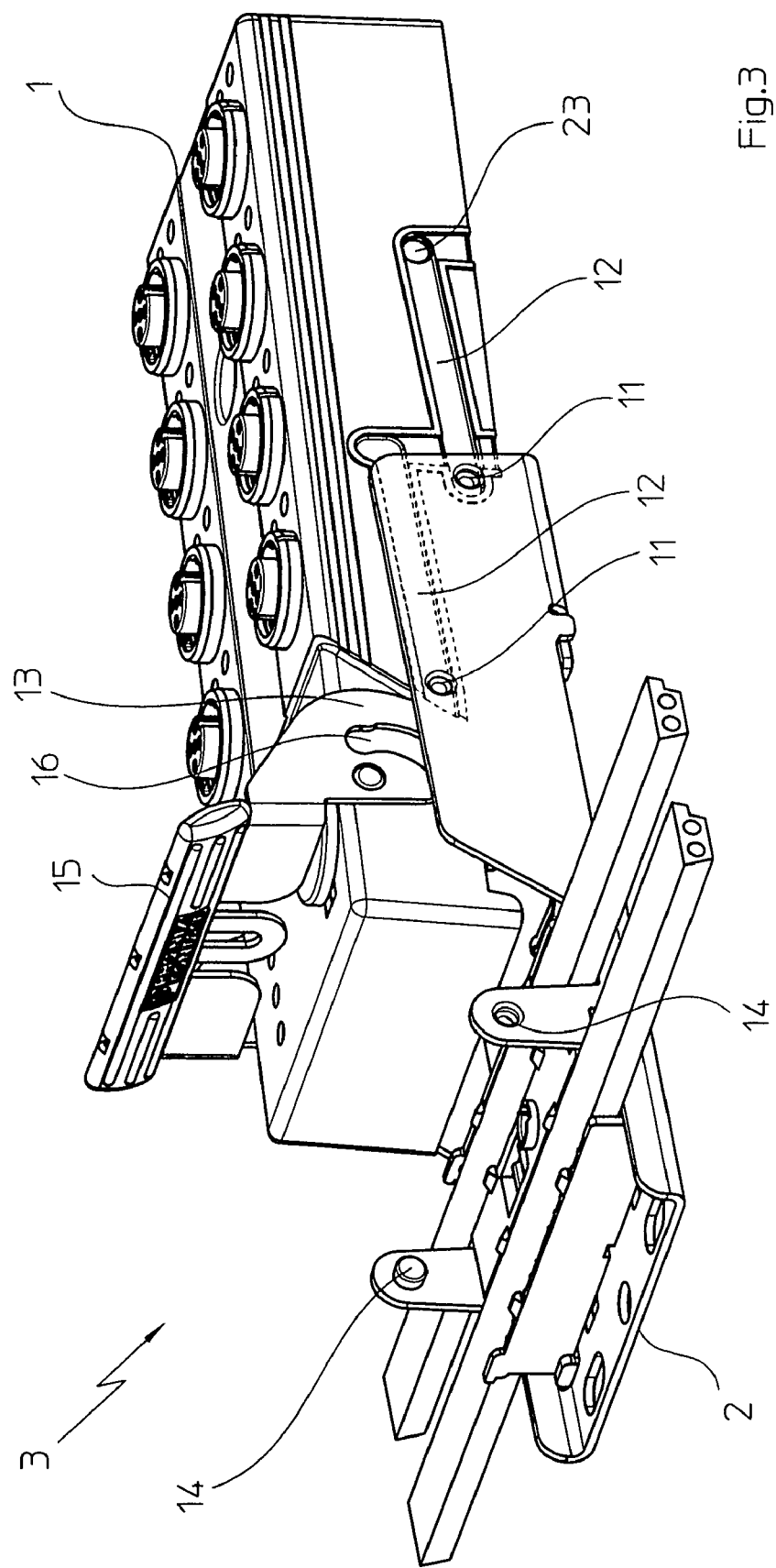
FIG. 3 shows the module of FIG. 1 in the installation position.
Figure 5:
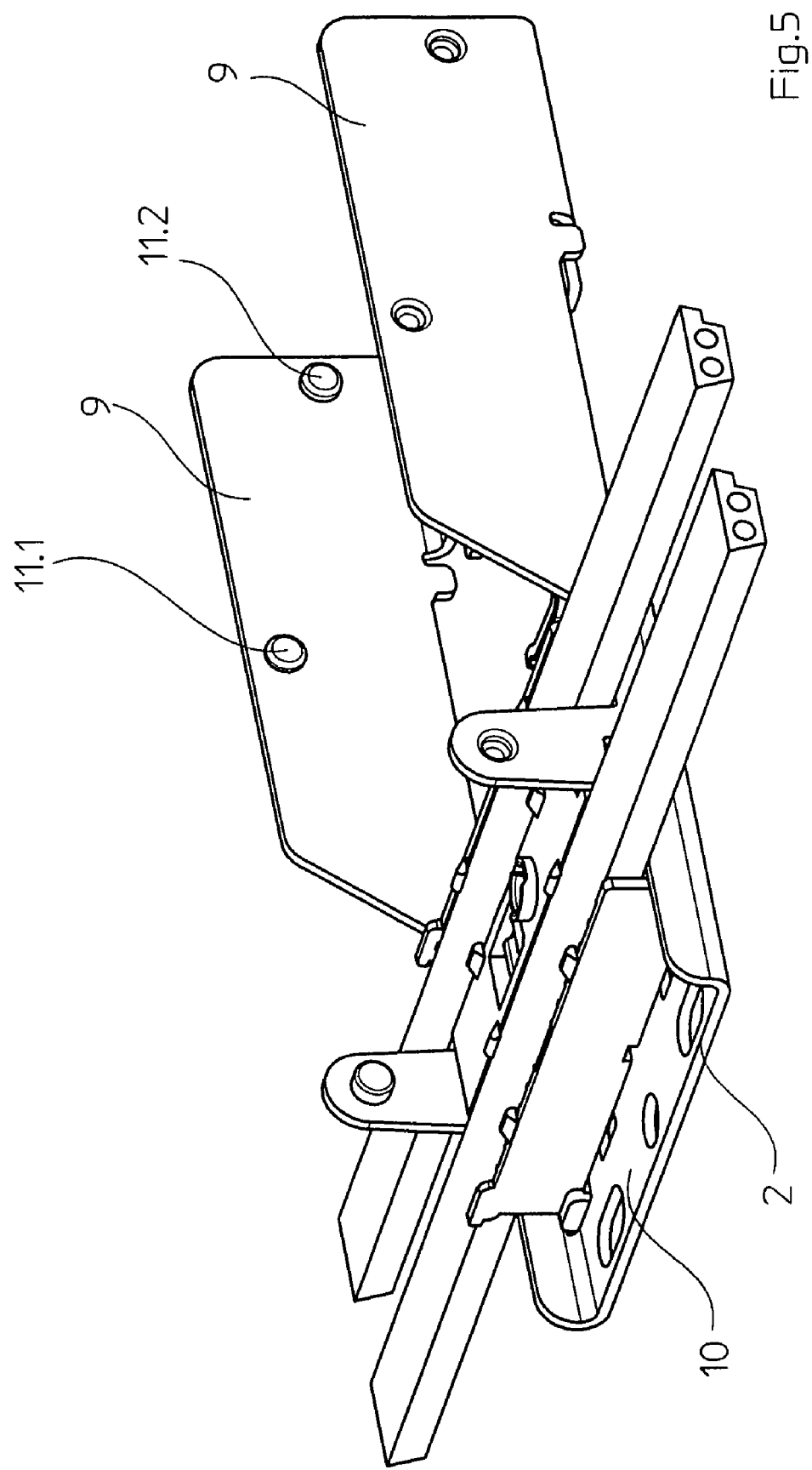
FIG. 5 shows the lower part of the module of FIG. 1, with a receiving insert, installed on its base, having recesses into which shape-coded conductors are placed.

Longitudinal sides 5 of upper housing part 1 are embodied as a guidance device 11, 12 by way of which upper housing part 1 is guidable from an installation position according to FIG. 3 for changing ribbon cables 8, into an initial fastening position shown in FIG. 2. From the initial fastening position according to FIG. 2, upper housing part 1 is fastenable onto lower part 2, with its fastening device 13, 14 arranged thereon, directly, i.e. without an intermediate installation step. This is achieved by mutually aligning upper housing part 1 with respect to lower part 2 and fastening device 13, 14. For alignment of upper housing part 1 with respect to lower part 2 in the transverse direction, lower part 2 as shown in FIG. 5 includes two side walls 9. The vertical spacing of side walls 9 with respect to one another is preferably selected to be somewhat smaller than the width of upper housing part 1, so that the latter is received in clamping fashion and no clearance exists in the transverse direction.

Figure 6:
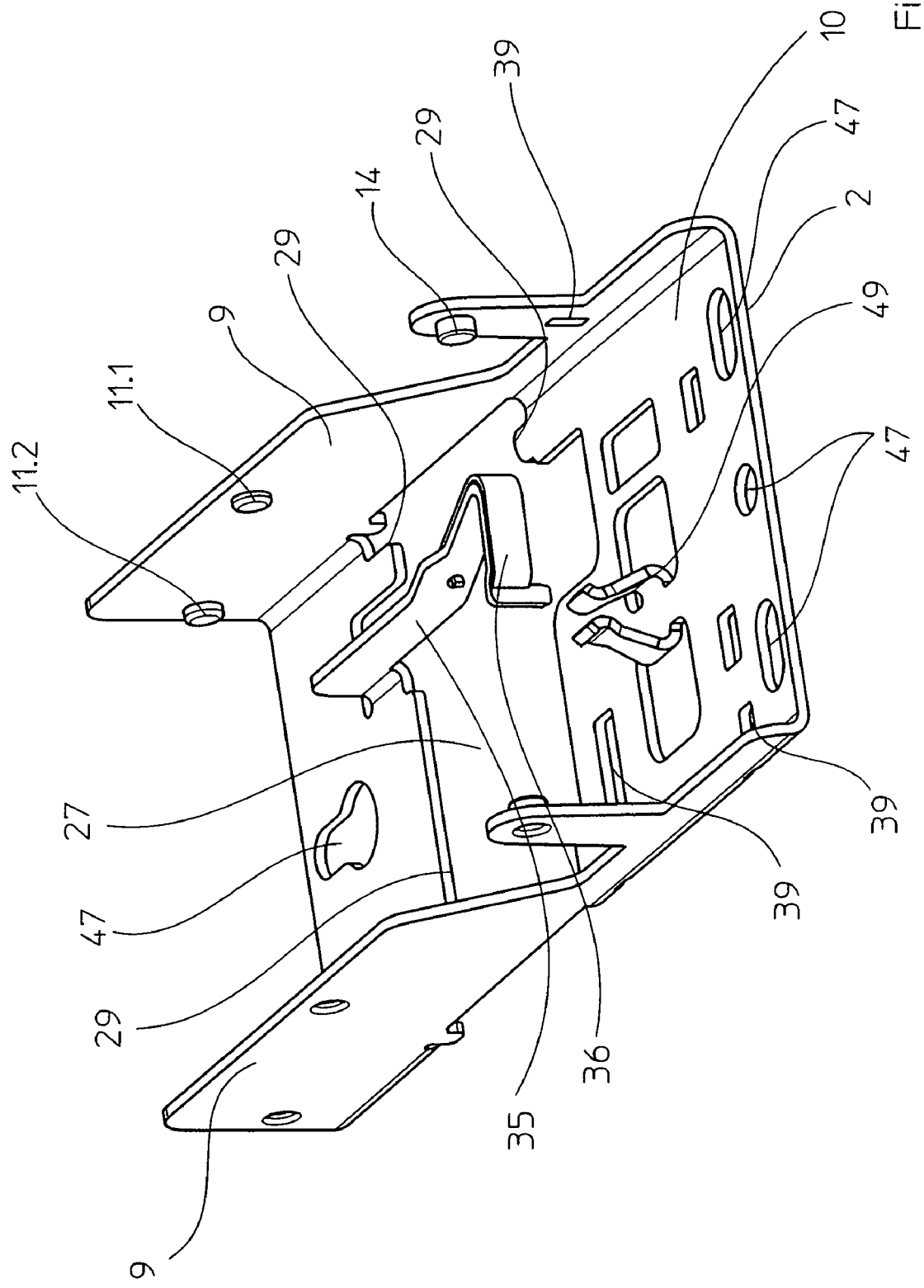
FIG. 6 shows the lower part of FIG. 5 in a depiction rotated with respect thereto, with a view of the base without a receiving insert.

As is evident from FIGS. 5 and 6, lower part 2 is constituted in the manner of a receiving chamber open at the end faces and having a base 10, a respective front guidance peg 11.1 and rear guidance peg 11.2 being provided on side walls 9 of said chamber. Guidance pegs 11.1, 11.2 each face toward the opposite side wall 9, and are arranged at different heights with reference to base 10. Guidance pegs 11.1, 11.2 constitute a first part of guidance device 11, 12 for controlled guidance of upper housing part 1 into the initial fastening position according to FIG. 2.

As a second part of guidance device 11, 12, guidance grooves 12 are provided on longitudinal sides 5 of upper housing part 1. The width of guidance grooves 12 is adapted to the diameter of guidance pegs 11. With module 3 in the assembled state as shown in FIGS. 1 to 3, guidance pegs 11 engage into guidance grooves 12. As a result of the coaction of guidance grooves 12 and guidance pegs 11, upper housing part 1 can be displaced relative to lower part 2, by way of a transversal motion, between the initial fastening position shown in FIG. 2 and the installation position according to FIG. 3.

Guidance grooves 12 extend obliquely with respect to upper side 4 and the lower side of upper housing part 1. In the initial fastening position according to FIG. 2, upper housing part 1 is correspondingly arranged tiltedly with respect to base 10 of lower part 2, the spacing between base 10 and upper housing part 1 being maximal at upper housing part end 18 that is arranged in the contact region.

A locking lever 13 supported on longitudinal sides 5, and locking pegs 14 mounted on side walls 9, are arranged in contact region 17 of module 3 as fastening device 13, 14. Locking lever 13 includes a handle 15 and a guidance segment 16 embodied in a curved shape.

For the transfer of module 3 from its initial fastening position as shown in FIG. 2 into its closed state according to FIG. 1, locking lever 13 is moved with its handle 15 toward terminals 7. At the beginning of this motion, the curve-shaped guidance segment 16 firstly surrounds locking pegs 14. As handle 15 is guided farther in the direction of terminals 7, the curve-shaped guidance segment 16 presses with its lower edge onto locking pegs 14, with the result that upper housing part 1 is pulled toward base 10 of lower part 2. In the context of this downward motion toward base 10, upper housing part 1 is pivoted about at least two guidance pegs 11 located opposite one another on the two side walls 9.

Alternatively to the embodiment described above, the locking lever can also be installed with a 180-degree rotation. Handle 15 must then be guided toward upper housing part end 18 in order to transfer the module from the initial fastening position according to FIG. 2 into the closed state according to FIG. 1.

Figure 4:
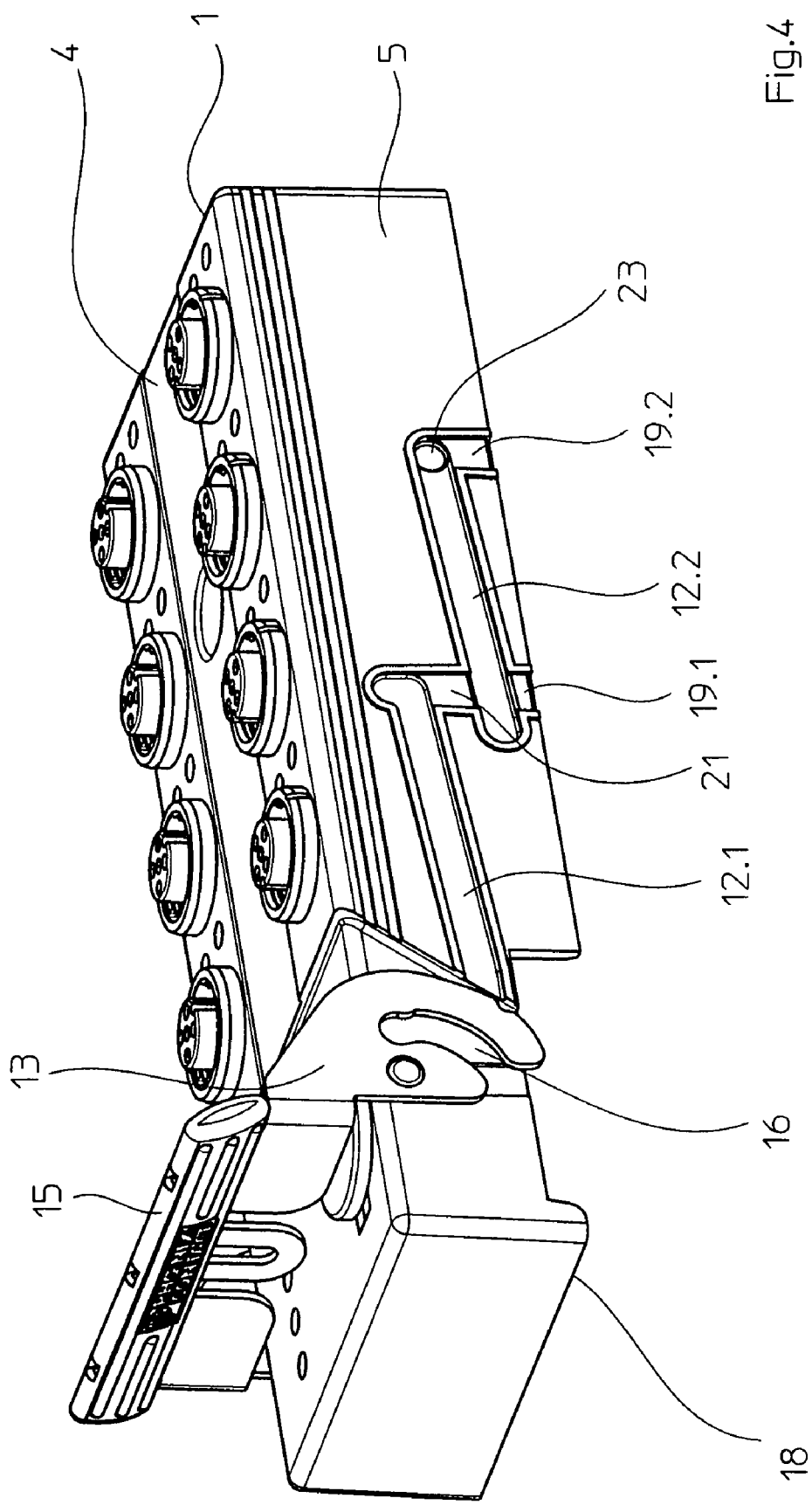
FIG. 4 shows the upper housing part of the module of FIG. 1, with guidance grooves embodied on its longitudinal sides.

As is evident from FIG. 4, an upper guidance groove 12.1 and a lower guidance groove 12.2 are arranged on each longitudinal side 5 of upper housing part 1. Lower guidance groove 12.2 is connected at its two end regions respectively to a rear insertion groove 19.2 proceeding from the lower edge of longitudinal side 5, and to a front insertion groove 19.1, while a connecting groove 21 opens from lower guidance groove 12.2 into upper guidance groove 12.1

The two insertion grooves 19.1, 19.2 and the two guidance pegs 11.1, 11.2 embodied on side walls 9 of lower part 2 respectively have the same spacing from one another in the longitudinal direction of module 3. The vertical spacing between front guidance peg 11.1 and rear guidance peg 11.2 with reference to base 10 corresponds to the vertical spacing between the two guidance grooves 12.1, 12.2 with reference to upper side 4 of upper housing part 1.

The result of the above-described coordination of the spatial arrangement of guidance pegs 11.1, 11.2 and grooves 12.1, 12.2, 19.2, 21 is that upper housing part 1 can be shifted by way of its insertion grooves 19.1, 19.2 onto guidance pegs 11.1, 11.2, such that front guidance pegs 11.1 can be guided via lower insertion grooves 12.2 and connecting grooves 21 into upper guidance grooves 12.1. Rear guidance pegs 11.2 can be guided only into lower guidance grooves 12.2.

The groove depth of connecting groove 21 and of insertion groove 19 is less than that of guidance grooves 12 so that the guidance walls of guidance grooves 12 are not broken through; this ensures secure guidance of upper housing part 1 via guidance pegs 11. In order to immobilize the upper housing part 1 in the initial fastening position and in the installation position, guidance grooves 12 have in their course detent positions 23 corresponding to the aforesaid positions. Detent positions 23 are provided as indentations into guidance grooves 12, the diameter of which preferably corresponds to that of guidance pegs 11.

Figure 9:
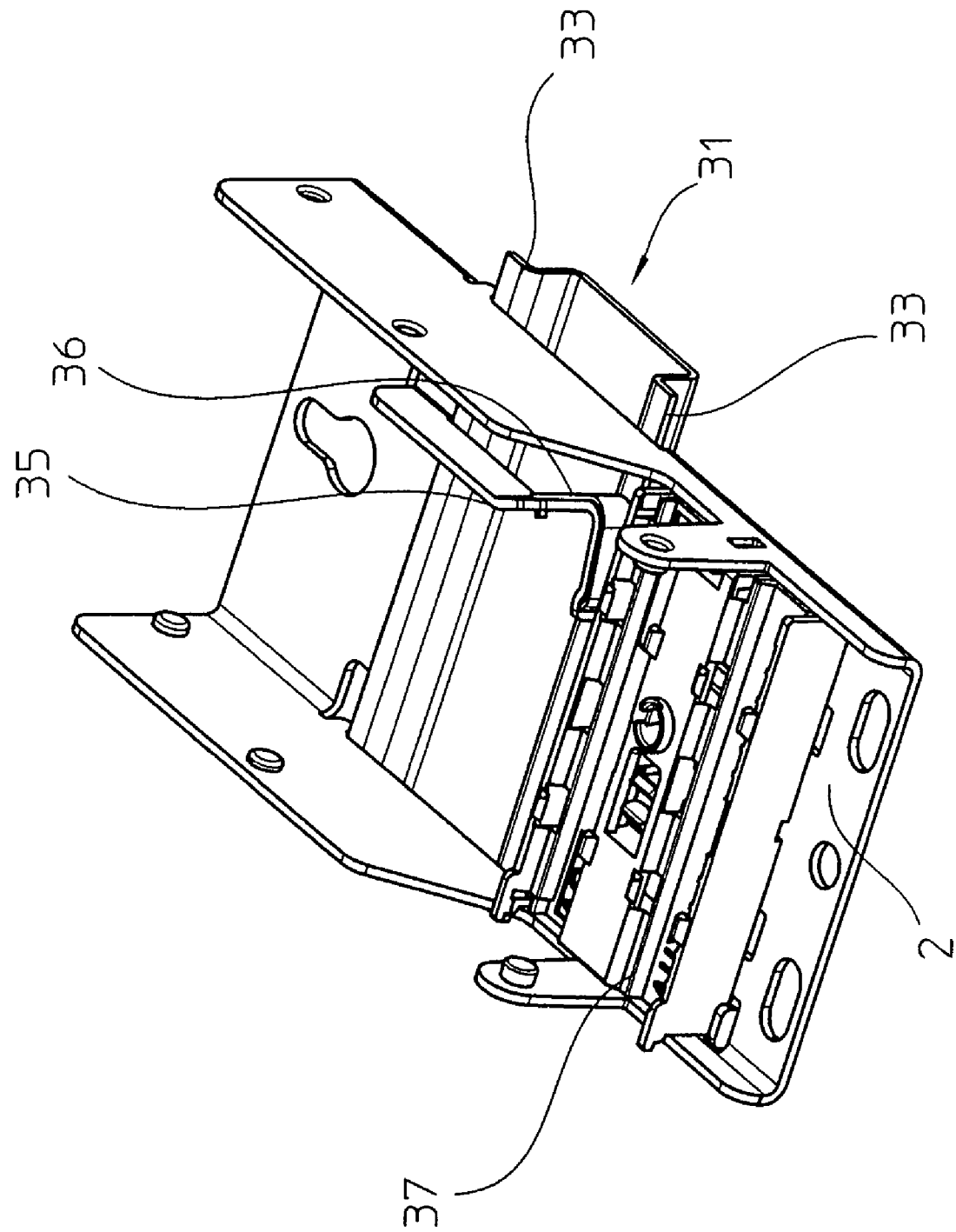
FIG. 9 shows the lower part of the module of FIG. 1, with a support rail received.

FIG. 6 shows lower part 2 separately, without upper housing part 1 in place and without a receiving insert 25, embodied as a loose part, for the reception of shape-coded ribbon cables 8. Lower part 2 is made at least for the most part from conductive metal. Base 10 encompasses a cut-out area 27 whose adjacent edge region 29 is dimensioned and shaped such that a support rail 31 can be received with its retaining segments 33 (see FIG. 9). For clamping of support rail 31, lower part 2 includes a spring 35 onto which an overlay spring 36 is preferably mounted in order to intensify its holding force. It is attached to base 10, and configured, in such a way that it extends in a longitudinal direction over most of the cut-out area 27, and clamps, at its retaining segments 33, a support rail 31 received by lower part 2. Spring 35 preferably overlaps a received support rail 31 in the latter's transverse direction in such a way that the force of spring 35 acts on retaining segment 33 of support rail 31, and longitudinally with respect to lower part 2 in the direction of guidance pegs 11.

Figure 7:
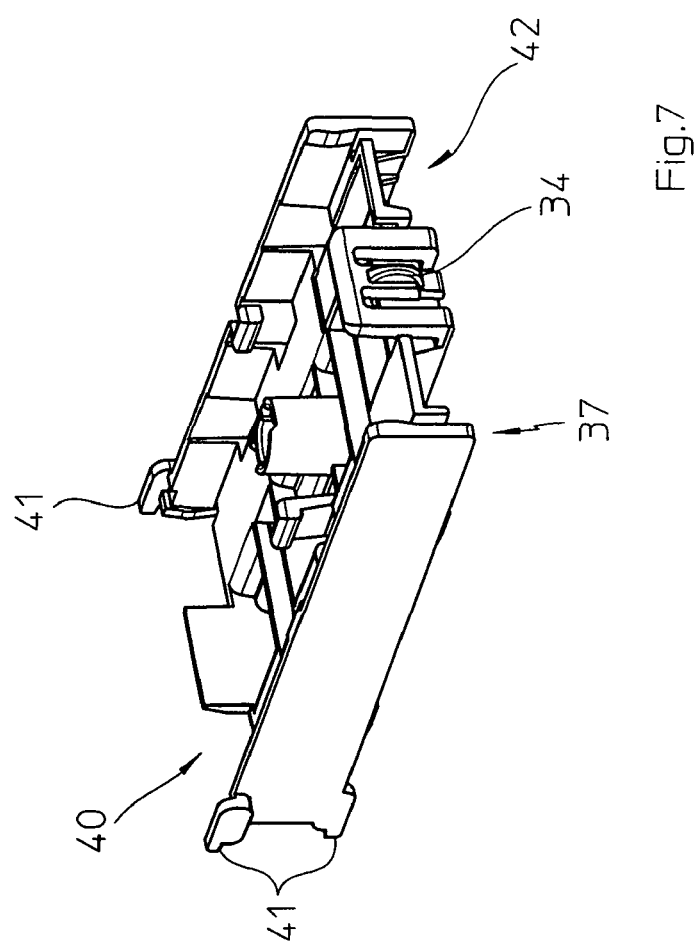
FIG. 7 is a perspective depiction of a receiving insert having recesses for the reception of shape-coded ribbon cables.

Lower part 2 includes apertures 39 for immobilization of a receiving insert 37 (depicted in FIG. 7) having recesses 38 for the reception of shape-coded ribbon cables 8. Said apertures are arranged asymmetrically with respect to a notional plane of symmetry between the two side walls 9. Corresponding to apertures 39, receiving insert 37 encompasses retaining lugs 41 only on a first narrow side 40 at its four corners, and a spring element 43 arranged on the second narrow side 42 located opposite thereto. Retaining lugs 41 and spring element 43 are arranged in such a way that receiving insert 37 can be inserted in two positions, rotated 180° from one another about its longitudinal axis, into lower part 2. Because of the above-described asymmetric arrangement of retaining lugs 41, spring element 43, and the corresponding apertures 39, receiving insert 37 cannot be inserted into lower part 2 in two positions rotated 180° from one another about its transverse axis. The result of the above-described arrangements of retaining lugs 41 and of spring element 43 is that only two positions exist for the insertion of receiving insert 37, and a coding exists.

Figure 8A:
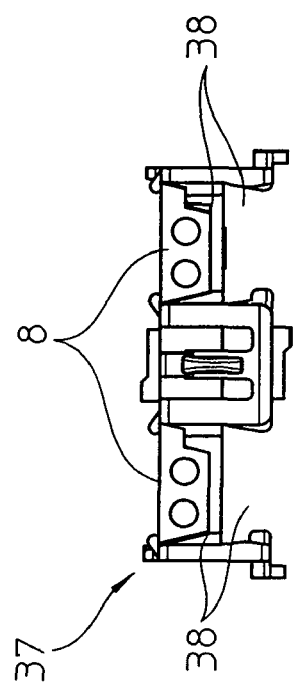
FIGS. 8a and 8b are front views of the receiving insert of FIG. 7.
Figure 8B:
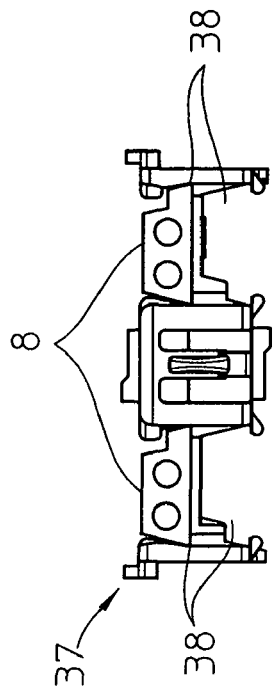

FIG. 8a depicts receiving insert 37 with shape-coded ribbon cables 8 placed into recesses 38, and FIG. 8b shows the same receiving insert 37 in the same view, rotated 180°. Receiving insert 37 with its recesses 38 is configured in such a way that in the two positions according to FIGS. 8a and 8b, shape-coded ribbon cables 8 can be respectively placed into the upward-facing recesses 38 only in one position. Receiving insert 37 can be used both in module 3 according to the present invention with its specifically configured guidance device 11, 12, and in existing modules.

According to the present embodiment, lower part 2 is embodied integrally with spring 35. Said part is made of sheet metal, and was manufactured using a stamping and bending method. As shown in FIG. 6, it includes a grounding contact 49 in addition to apertures 39 and installation orifices 47. Said contact is preferably tulip-shaped, and bent outward from base 10.

The present invention is not limited to the embodiments described herein; reference should be had to the appended claims.

The invention claimed is:

1. A module having terminals for actuators and sensors, comprising:
   a lower portion having at least one recess configured to receive a shape-coded ribbon cable having a plurality of conductors;
   an upper housing portion configured to receive a circuit board and to be disposed on the lower portion via a fastening device, the upper housing portion including a first longitudinal side, a second longitudinal side, a first end face, and a second end face; and
   a guidance device disposed on at least one of the upper housing portion and the lower portion and configured to cooperate with the first and second longitudinal sides of the upper housing portion so that the upper housing portion is guidable via a transversal motion into an initial fastening position for fastening the upper housing portion to the lower portion;
   wherein at least one of the upper housing portion and the lower portion include a contact device having at least one contact pin configured to at least partially penetrate the shape-coded ribbon cable when the shape-coded ribbon cable is received in the at least one recess so as to contact with the plurality of conductors when the upper housing portion is fastened to the lower portion.

2. The module as recited in claim 1, wherein the lower portion includes a base and a first side wall and a second side wall, the first and second side walls being disposed opposite each other and forming at least a portion of the guidance device.

3. The module as recited in claim 2, wherein the lower portion includes a receiving chamber having an open end including the base and the first and second side walls of the lower portion.

4. The module as recited in claim 1, wherein the guidance device is configured to peripherally secure the upper housing portion.

5. The module as recited in claim 2, wherein the guidance device includes at least one guidance peg disposed on each of the first and second longitudinal sides of the upper housing portion, and at least one guidance groove disposed on each of the first and second side walls configured to guide the upper housing portion in cooperation with the at least one guidance pegs.

6. The module as recited in claim 2, wherein the guidance device includes at least one guidance peg disposed on each of the first and second side walls extending towards the opposite side wall, and at least one guidance groove disposed on each of the first and second longitudinal sides of the upper housing portion configured to guide the upper housing portion in cooperation with the at least one guidance pegs.

7. The module as recited in claim 6, further comprising an associated insertion groove extending from each of the at least one guidance grooves to an edge of the respective longitudinal side.

8. The module as recited in claim 7, wherein each of the insertion grooves has a depth less than half a depth of the associated guidance groove.

9. The module as recited in claim 8, wherein the upper housing portion includes a lower side and an upper side disposed opposite each other, wherein the at least one terminal is disposed on at least one of the lower side and the upper side, and wherein the at least one guidance groove extends obliquely relative to the lower side and the upper side.

10. The module as recited in claim 9, wherein the at least one guidance groove includes a first guidance groove and a second guidance groove disposed on each of the first and second longitudinal sides and parallel to each other, and wherein the at least one guidance peg includes a first guidance peg and a second guidance peg associated with a respective guidance groove and disposed on each of the first and second side walls.

11. The module as recited in claim 10, wherein the first and second guidance grooves are connected to each other via an associated connecting groove.

12. The module as recited in claim 11, wherein each of the connecting grooves extends perpendicular to at least one of the lower side and the upper side of the upper housing portion.

13. The module as recited in claim 11, wherein each of the connective grooves has a depth less than half the depth of the associated guidance groove.

14. The module as recited in claim 5, wherein each of the at least one guidance grooves includes a detent configured for detent engagement of the respective guidance peg.

15. The module as recited in claim 5, wherein each of the at least one guidance pegs includes an indentation in the associated side wall.

16. The module as recited in claim 1, wherein the fastening device includes a first portion disposed on at least one of the first and second longitudinal sides and first and second end faces of the upper housing portion and a second portion disposed on the lower portion.

17. The module as recited in claim 16, wherein the second portion of the fastening device is disposed on the side walls of the lower portion.

18. The module as recited in claim 16, wherein the fastening device includes a pivotably supported locking lever configured to cooperate with a respective locking peg.

19. The module as recited in claim 1, wherein the lower portion includes a metal.

20. The module as recited in claim 1, wherein the lower portion is stamped and bent.

21. The module as recited in claim 2, wherein the base includes a cut-out area having an edge region and configured to receive a support rail having at least one retaining segment.

22. The module as recited in claim 21, wherein the lower portion includes a spring configured to secure the support rail when the support rail is received in the edge region.

23. The module as recited in claim 22, wherein the spring is configured to secure the received support rail via the at least one retaining segment.

24. The module as recited in claim 23, wherein the spring is disposed to overlap the received support rail in a transverse direction thereof.

* * * * *